(12) United States Patent
Takagi et al.

(10) Patent No.: US 10,030,156 B2
(45) Date of Patent: Jul. 24, 2018

(54) CONDUCTIVE PASTE FOR FORMING CONDUCTIVE FILM FOR SEMICONDUCTOR DEVICES, SEMICONDUCTOR DEVICE, AND METHOD FOR PRODUCING SEMICONDUCTOR DEVICE

(71) Applicant: KYOTO ELEX CO., LTD., Kyoto-shi (JP)

(72) Inventors: Kazuya Takagi, Kyoto (JP); Seiichi Nakatani, Osaka (JP); Kenichi Harigae, Saitama (JP); Nobuo Ochiai, Kyoto (JP); Masashi Nakayama, Kyoto (JP); Kairi Otani, Kyoto (JP); Nozomu Hayashida, Shiga (JP)

(73) Assignee: KYOTO ELEX CO., LTD., Kyoto-shi (JP)

( * ) Notice: Subject to any disclaimer, the term of this patent is extended or adjusted under 35 U.S.C. 154(b) by 0 days.

(21) Appl. No.: 14/562,512

(22) Filed: Dec. 5, 2014

(65) Prior Publication Data
US 2015/0159025 A1    Jun. 11, 2015

(30) Foreign Application Priority Data

Dec. 10, 2013 (JP) .................................. 2013-254925

(51) Int. Cl.
| | |
|---|---|
| H01L 23/48 | (2006.01) |
| C09D 5/24 | (2006.01) |
| H01L 23/482 | (2006.01) |
| H01L 31/0224 | (2006.01) |
| H01L 31/0216 | (2014.01) |

(52) U.S. Cl.
CPC ............. *C09D 5/24* (2013.01); *H01L 23/4828* (2013.01); *H01L 31/02168* (2013.01); *H01L 31/022425* (2013.01); *H01L 2924/0002* (2013.01); *Y02E 10/50* (2013.01)

(58) Field of Classification Search
CPC .................. C09D 5/24; H01L 23/4828; H01L 31/022425; H01L 21/288; H01L 2924/0002
USPC ........................................................ 257/746
See application file for complete search history.

(56) References Cited

U.S. PATENT DOCUMENTS

| | | | |
|---|---|---|---|
| 2004/0055635 A1* | 3/2004 | Nagakubo ................. | C03C 8/10 |
| | | | 136/261 |
| 2009/0095344 A1 | 4/2009 | Machida et al. | |
| 2009/0266409 A1 | 10/2009 | Wang et al. | |

(Continued)

FOREIGN PATENT DOCUMENTS

| | | |
|---|---|---|
| JP | 58-87165 | 5/1983 |
| JP | 2011-510897 A | 4/2011 |

(Continued)

*Primary Examiner* — Anthony Ho
*Assistant Examiner* — Mohammad M Hoque
(74) *Attorney, Agent, or Firm* — Marshall, Gerstein & Borun LLP

(57) ABSTRACT

Disclosed herein is a conductive paste for forming a conductive film, including: (A) a conductive powder; (B) as a first additive, at least one selected from a first group consisting of Se, Te, a compound containing Se, and a compound containing Te; (C) as a second additive, a compound containing at least one element selected from a second group consisting of V, Nb, Ta, Sb, Bi, Mn, Ge, Si, and W; (D) glass frit; (E) an organic binder; and (F) a solvent.

7 Claims, 5 Drawing Sheets

(56) References Cited

U.S. PATENT DOCUMENTS

| | | | |
|---|---|---|---|
| 2011/0192457 A1 | 8/2011 | Nakayama et al. | |
| 2011/0308597 A1* | 12/2011 | Carroll | B22F 1/0059 136/256 |
| 2013/0043441 A1* | 2/2013 | Ozawa | H01B 1/22 252/513 |
| 2013/0130435 A1* | 5/2013 | Konig | H01L 31/18 438/98 |
| 2013/0269772 A1* | 10/2013 | Wang | C03C 8/14 136/256 |
| 2014/0021417 A1* | 1/2014 | Koike | H01B 1/22 252/514 |
| 2015/0155401 A1* | 6/2015 | Kurtz | H01B 1/22 136/256 |

FOREIGN PATENT DOCUMENTS

| | | | |
|---|---|---|---|
| JP | 2011181538 A * | 9/2011 | |
| JP | 2014-078594 A | 5/2014 | |
| JP | 2014078594 A * | 5/2014 | |
| WO | WO-2007/125879 A1 | 11/2007 | |
| WO | WO-2009/134646 A1 | 11/2009 | |
| WO | WO-2010/016186 A1 | 2/2010 | |
| WO | WO 2012135551 A1 * | 10/2012 | H01B 1/22 |

\* cited by examiner

CONDUCTIVE PASTE FOR FORMING CONDUCTIVE FILM FOR SEMICONDUCTOR DEVICES, SEMICONDUCTOR DEVICE, AND METHOD FOR PRODUCING SEMICONDUCTOR DEVICE

FIELD OF THE INVENTION

The present invention relates to a conductive paste for use in forming a conductive film of a semiconductor device, a semiconductor device having a conductive film formed using the conductive paste, and a method for producing the same. More particularly, the present invention relates to a conductive paste for forming a conductive film which can be suitably used for forming an electrode or the like of a semiconductor device, especially a solar cell element, a semiconductor device including the conductive paste for forming a conductive film, and a method for producing the same.

BACKGROUND OF THE INVENTION

A technique for use in producing various semiconductor devices is known in which a conductive film for use as an electrode, wiring, or the like is formed using a conductive paste. Formation of such a conductive film will be described with reference to a solar cell element as a typical example of a semiconductor device.

A common solar cell element includes a semiconductor substrate, a diffusion layer, an antireflective layer, a back electrode, and a front electrode. The semiconductor substrate is doped with a trace amount of semiconductor impurity. For example, when silicon is used as a semiconductor material, a p-type semiconductor is obtained by doping silicon with a trivalent element such as boron, and an n-type semiconductor is obtained by doping silicon with a pentavalent element such as phosphorus. The diffusion layer is formed on the light-receiving surface (front surface) side of the semiconductor substrate.

The diffusion layer is a region having a conductivity type opposite to that of the semiconductor substrate. For example, when the semiconductor substrate is of p-type, an n-type diffusion layer is formed by diffusing a pentavalent element into the light-receiving surface. On the other hand, when the semiconductor substrate is of n-type, a p-type diffusion layer is formed by diffusing a trivalent element into the light-receiving surface. The antireflective layer is formed on the light-receiving surface side of the diffusion layer to prevent the reflection of incident light and protect the front surface of the solar cell element.

The front electrode is formed on the surface of the diffusion layer, and the back electrode is formed on the back surface of the semiconductor substrate. It is to be noted that a BSF (Back Surface Field) layer may be formed on the back surface of the semiconductor substrate so that the back electrode is formed on the BSF layer. These front electrode and back electrode are formed as conductive films using a conductive paste. Specifically, a conductive paste is printed and dried to form a pattern of the front electrode or back electrode, and is then fired under predetermined conditions to form an electrode made of a conductive film having a predetermined pattern. The front electrode and the back electrode may be formed using the same conductive paste to have the same composition or may be formed using different conductive pastes to have their respective suitable compositions.

In the solar cell element, as described above, the antireflective layer is formed on the surface of the diffusion layer. Therefore, when the front electrode is formed, the conductive paste needs to achieve good fire-through upon firing. Fire-through is a phenomenon in which glass frit contained in a conductive paste acts on an antireflective layer upon firing to dissolve and remove the antireflective layer so that a front electrode and a diffusion layer come into direct contact with each other and an ohmic contact is obtained.

If a stable ohmic contact cannot be obtained between the front electrode and the diffusion layer, a solar cell tends to have a reduced fill factor (FF) due to an increase in series resistance. The conversion efficiency of a solar cell is a value determined by multiplying open-circuit voltage by short-circuit current density by FF. Therefore, when FF is reduced, the conversion efficiency is reduced.

In order to achieve good fire-through upon firing, techniques have been heretofore proposed in which various additives are added to a conductive paste. For example, Patent Document 1: WO 2007/125879 A discloses a conductive paste for solar cell electrodes which contains, as an additive in addition to an organic binder, a solvent, conductive particles, and glass frit, (1) a combination of a substance that changes to gas at a temperature in the range of 150 to 800° C. and a metal oxide, (2) a combination of an organic metal compound and a metal oxide, or (3) a compound containing Al, Ga, In, or Tl.

Further, Patent Document 2: WO 2009/134646 A discloses a thick-film conductive composition (conductive paste) containing, in addition to a conductive powder, glass frit, and an organic medium, (1) a first additive selected from the group consisting of (i) a bismuth-containing additive and a phosphorus-containing additive, (ii) a metal oxide of one or more of bismuth and phosphorus, (iii) any compound that can generate the metal oxides of (ii) upon firing, and (iv) mixtures thereof and (2) a second additive selected from the group consisting of (i) a metal oxide additive and (ii) a compound that can generate a metal oxide upon firing.

Further, the present inventors have proposed a conductive paste for forming an electrode disclosed in Patent Document 3: WO 2010/016186 A, which contains, in addition to conductive particles, an organic binder, a solvent, and glass frit, (1) an organic compound containing an alkaline-earth metal, (2) a low-melting-point metal, (3) a low-melting-point metal-based compound, (4) a combination of an organic compound containing an alkaline-earth metal and a low-melting-point metal, or (5) a combination of an organic compound containing an alkaline-earth metal and a low-melting-point metal-based compound. This conductive paste preferably contains selenium (Se) or tellurium (Te) as the low-melting-point metal and a Se compound or a Te compound as the low-melting-point metal-based compound.

SUMMARY OF THE INVENTION

In recent years, in the field of semiconductor devices such as solar cells, there is a tendency to reduce the firing temperature of a conductive paste in their production process.

A conductive paste usually has a wide firing temperature setting range. For example, Patent Document 1 discloses that the peak firing temperature of the conductive paste is in the range of 600 to 850° C. (e.g., paragraph [0065]), Patent Document 2 discloses that firing is performed within a set point temperature range of 700 to 975° C. (lines 26 to 32 on page 33), and Patent Document 3 discloses that the peak firing temperature of the conductive paste is in the range of 750 to 950° C.

However, Patent Document 1 states that the peak firing temperature is generally set to up to about 850° C. (e.g., paragraph [0032]), and Patent Document 3 states that conductive pastes of examples were fired at a firing temperature of 800° C. (paragraph [0085]). As described above, a general firing temperature of 800° C. or 850° C. is often used. However, from the viewpoint of reducing production cost or minimizing exposure of the substrate (usually, silicon wafer) of a semiconductor device to high temperature, a study has recently been made to reduce the firing temperature to, for example, about 750° C.

On the other hand, if a conductive paste is fired at too low a firing temperature, there is a fear that fire-through cannot sufficiently proceed upon firing. If fire-through does not proceed, a stable ohmic contact cannot be obtained between a front electrode and a diffusion layer. As a result, FF is reduced, and therefore the conversion efficiency of a solar cell is reduced.

The conductive paste disclosed in Patent Document 3 contains, as an additive, Se, Te, or a compound thereof, and therefore good fire-through can be achieved upon firing as long as the peak firing temperature is in the above range of 750 to 950° C. However, 750° C. is the lower limit of a preferred firing temperature range. In order to achieve more stable fire-through even at about 750° C., there is a demand for a conductive paste having improved performance upon firing.

In order to solve such a problem, an object of the present invention is to provide a conductive paste for forming a conductive film of a semiconductor device, which contains, as an additive, Se, Te, or a compound thereof to achieve good fire-through even at a reduced firing temperature.

In order to achieve the above object, the present invention is directed to a conductive paste for forming a conductive film of a semiconductor device, including: (A) a conductive powder; (B) as a first additive, at least one selected from a first group consisting of Se, Te, a compound containing Se, and a compound containing Te; (C) as a second additive used in combination with the first additive, a compound containing at least one element selected from a second group consisting of V, Nb, Ta, Sb, Bi, Mn, Ge, Si, and W; (D) glass frit; (E) an organic binder; and (F) a solvent.

DETAILED DESCRIPTION

Figure 1:
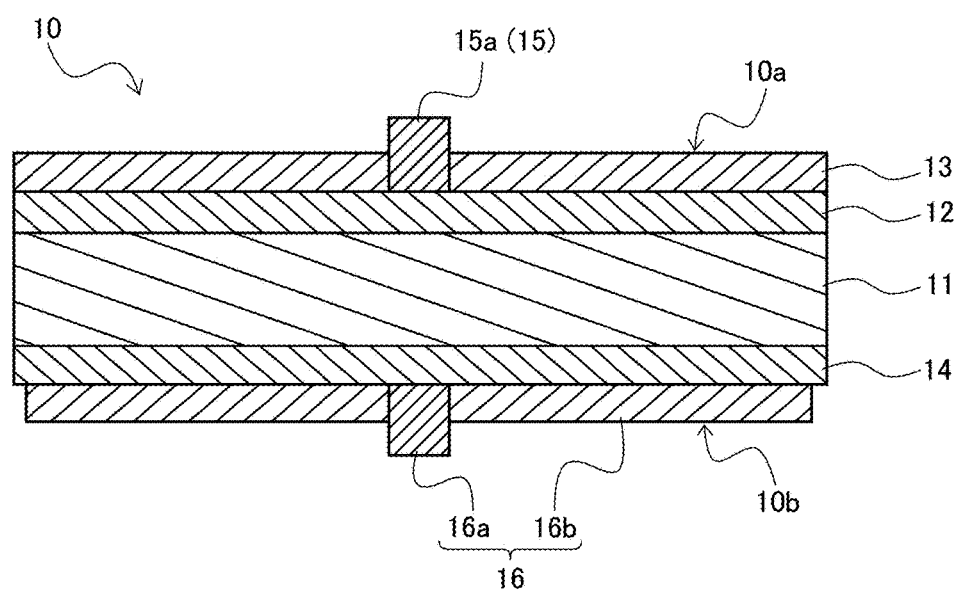
FIG. 1 is a schematic sectional view showing the structure of a solar cell element according to one embodiment as one example of a semiconductor device according to the present invention.

A conductive paste for forming a conductive film according to the present invention is used for forming a conductive film of a semiconductor device, and includes: (A) a conductive powder; (B) as a first additive, at least one selected from a first group consisting of Se, Te, a compound containing Se, and a compound containing Te; (C) as a second additive used in combination with the first additive, a compound containing at least one element selected from a second group consisting of V, Nb, Ta, Sb, Bi, Mn, Ge, Si, and W; (D) glass frit; (E) an organic binder; and (F) a solvent.

When the conductive paste contains, as an additive, the first additive, that is, Se, Te, or a compound thereof, a compound containing at least one element selected from the second group is used as the second additive in combination with the first additive. The first additive allows the conductive paste to achieve good fire-through particularly at a firing temperature of about 800 to 850° C., and the combined use of the first additive and the second additive allows the conductive paste to achieve fire-through as good as or better than that achieved by firing at about 800 to 850° C. even when the firing temperature is reduced to, for example, about 750° C.

The conductive powder (A) of the conductive paste for forming a conductive film may contain at least one metal selected from a third group consisting of Ag, Cu, Ni, Al and Pd.

Further, the conductive powder (A) of the conductive paste for forming a conductive film may be at least one of (A-1) a metal powder made of at least one metal selected from the third group, (A-2) an alloy powder containing at least one metal selected from the third group, (A-3) a coated powder whose surface is coated with at least one metal selected from the third group, and (A-4) a metal compound powder made of a compound of at least one metal selected from the third group so as to develop conductivity after heat treatment.

Further, the conductive powder (A) of the conductive paste for forming a conductive film may be a silver-based powder having a specific surface area of 0.2 to 3.0 $m^2/g$, a tapped density of 2 to 6 $g/cm^3$, an average particle size of 0.1 to 5.0 µm, and an ignition loss after removing moisture by heat treatment of 0.05 to 1.0%.

Further, the first additive (B) content of the conductive paste for forming a conductive film may be in the range of 0.01 to 10 wt % with respect to the total weight of the conductive paste for forming a conductive film, and the second additive (C) content of the conductive paste for forming a conductive film may be in the range of 0.01 to 5 wt % with respect to the total weight of the conductive paste for forming a conductive film.

Further, the second additive (C) of the conductive paste for forming a conductive film may be at least one of an oxide, a chloride, a fluoride, a hydroxide, a nitrate, a carbonate, and an organic complex of at least one element selected from the second group.

Further, the glass frit (D) of the conductive paste for forming a conductive film may be at least one selected from the group consisting of BaO—$B_2O_3$-based glass, BaO—$B_2O_3$—ZnO-based glass, $B_2O_3$—$SiO_2$-based glass, and $B_2O_3$—$SiO_2$—ZnO-based glass.

The present invention further includes a semiconductor device having a conductive film that is formed by printing and firing the conductive paste for forming a conductive film and that has closed cells in at least either its surface or inside.

The present invention further includes a semiconductor device production method including the step of printing and firing the conductive paste for forming a conductive film to form a conductive film.

As described above, the conductive paste for forming a conductive film of a semiconductor device according to the present invention contains, as an additive, Se, Te, or a compound thereof, and is therefore effective at achieving good fire-through even at a reduced firing temperature.

Hereinbelow, one example of a preferred embodiment of the present invention will be specifically described. As described above, the conductive paste for forming a conductive film according to the present invention is used for forming a conductive film of a semiconductor device, and includes (A) a conductive powder, (B) a first additive, (C) a second additive, (D) glass frit, (E) an organic binder, and (F) a solvent. Among these components, the first additive (B) contributes to fire-through upon firing. Specifically, the first additive (B) is at least one selected from a first group consisting of Te, a compound containing Se, and a compound containing Te. The second additive (C) is used in combination with the first additive (B) and contributes to the fire-through. Specifically, the second additive (C) is a compound of at least one metal selected from a second group consisting of V, Nb, Ta, Sb, Bi, Mn, Ge, Si, and W.

Each of the components of such a conductive paste for forming a conductive film will be specifically described below. It is to be noted that for the sake of convenience, the conductive paste for forming a conductive film is sometimes abbreviated as "conductive paste".

(A) Conductive Powder

The conductive powder (A) used in the present invention is not particularly limited as long as it is a publicly known powder (powder or particles) having conductivity. However, typically, the conductive powder (A) is preferably a powder containing at least one metal selected from a third group consisting of silver (Ag), copper (Cu), nickel (Ni), aluminum (Al), and palladium (Pd). Here, the powder containing at least one metal selected from the third group may be at least one of (A-1) a metal powder made of at least one metal selected from the third group, (A-2) an alloy powder containing at least one metal selected from the third group, (A-3) a coated powder whose surface is coated with at least one metal selected from the third group, and (A-4) a metal compound powder made of a compound of at least one metal selected from the third group so as to develop conductivity after heat treatment. It is to be noted that it goes without saying that the temperature of heat treatment performed on the metal compound powder (A-4) is not particularly limited and varies depending on the specific type of the metal compound constituting the powder.

More specific examples of the conductive powder (A) include, but are not limited to, the metal powder (A-1) such as a silver powder, a nickel powder, a copper powder, an aluminum powder, a gold powder, or a palladium powder; the alloy powder (A-2) such as a silver-containing alloy powder; the coated powder (A-3) such as a silver-coated powder; and the metal compound powder (A-4) such as a silver oxide powder, a silver carbonate powder, or a silver acetate powder. Examples of the silver-containing alloy powder include, but are not limited to, a silver-nickel alloy powder, a silver-magnesium alloy powder, a silver-silicon alloy powder, a silver-zirconium alloy powder, a silver-manganese alloy powder, a silver-copper alloy powder, and a silver-palladium alloy powder. Examples of the silver-coated powder include, but are not limited to, a powder obtained by coating the surface of a copper powder with silver and a powder obtained by coating the surface of a nickel powder with silver.

These conductive powders (A) may be used singly or in appropriate combination of two or more of them. The conductive powder (A) may contain a metal other than the metals of the third group, a semimetal (e.g., silicon), or a conductive compound.

Examples of the shape of the conductive powder (A) include, but are not limited to, a scale-like shape, a spherical shape, a flake-like shape, and an indefinite shape. The conductive powder (A) having one shape may be singly used, or the conductive powders (A) different in shape may be used in combination.

The conductive powder (A) preferably has an average particle size in the range of 0.1 to 15 μm. The average particle size is a particle size at 50% cumulation from the smallest particle size side determined by microtrac particle size distribution measurement. The conductive powder (A) having a large particle size is sintered at a slower rate than the conductive powder (A) having a small particle size. Therefore, when having an average particle size within the above range, the conductive powder (A) can be sintered at an appropriate rate in both cases where the firing temperature is about 800 to 850° C. and where the firing temperature is about 750° C. If the average particle size is less than 0.1 μm, sintering proceeds too fast, and therefore there is a possibility that physical adhesive strength is poor. On the other hand, if the average particle size exceeds 15 μm, sintering proceeds at a slightly slow rate, but there is a fear that dispersibility in the conductive paste and printability are deteriorated so that fine line printing is difficult.

Further, the conductive powder (A) preferably has a specific surface area in the range of 0.05 to 5 $m^2/g$. The specific surface area is a value measured by a BET method. If the specific surface area is less than 0.5 $m^2/g$, there is a case where the particle size is large and therefore fine lines cannot be drawn. On the other hand, if the specific surface area exceeds 5 $m^2/g$, there is a case where, for example, a large amount of a solvent is required to adjust the viscosity, which deteriorates workability.

In the present invention, the conductive powder (A) is particularly preferably a powder containing silver in terms of resistance to oxidation upon firing in the atmosphere and production cost. It is to be noted that for the sake of convenience, the conductive powder containing silver is referred to as "silver-based powder" as appropriate.

As exemplified above, the silver-based powder may be any one of a powder made only of silver, a silver-containing alloy powder, a silver-coated powder, and a silver compound powder, but the silver content of the silver-based powder is preferably in the range of 70 to 100 wt %.

Here, the average particle size and specific surface area of the conductive powder (A) are preferably within their respective ranges described above, but when the conductive powder (A) is a silver-based powder, more preferred ranges of the average particle size, specific surface area, and other powder characteristics of the silver-based powder have been found.

Specifically, the silver-based powder preferably has an average particle size in the range of 0.1 to 5.0 μm. When the average particle size is 5.0 μm or less, dispersibility in the conductive paste and printability are further improved. This makes it possible to further reduce the electrical resistance of a conductive film obtained by sintering the conductive paste and to print the conductive film as a finer line. Of course, there is no problem even when the silver-based powder has an average particle size of 5.0 μm or more.

Further, the silver-based powder preferably has a specific surface area in the range of 0.2 to 3.0 $m^2/g$. When the specific surface area of the silver-based powder is within the above range, sintering easily proceeds upon firing, which makes it easy to reduce electrical resistance and is also advantageous for fine line printing. Generally, the silver-based powder having a smaller particle size is more likely to aggregate, and therefore when the specific surface area of the silver-based powder is within the above range, aggregation of the silver-based powder is moderately facilitated. Therefore, the compactness of a conductive film obtained by sintering can be appropriately ensured, which also makes it easy to reduce electrical resistance.

Particularly, it is relatively difficult to sinter the silver-based powder having a specific surface area of 0.2 m$^2$/g, but since the conductive paste according to the present invention has the above-described composition, sintering of such a silver-based powder can be achieved to such a level that there is no problem with electrical characteristics.

It is to be noted that the silver-based powder having a specific surface area exceeding 3.0 m$^2$/g is generally often expensive, and therefore its use for forming a conductive film of a semiconductor device tends to be disadvantageous in terms of cost.

Further, the silver-based powder preferably has a tapped density in the range of 2 to 6 g/cm$^3$. The tapped density is a value determined by tapping 15 g of a sample of the silver-based powder contained in a test tube for measuring tapped density 1000 times with a tapping device and then measuring the volume and weight of the silver-based powder. If the tapped density of the silver-based powder is less than 2 g/cm$^3$, there is a case where a resulting conductive film tends to have low compactness, and therefore the electrical resistance of the conductive film cannot be appropriately reduced. On the other hand, the upper limit of the tapped density is preferably as high as possible. It is to be noted that the tapped density of a generally-available silver-based powder is 6 g/cm$^3$ or less, and therefore in this embodiment, the upper limit of the tapped density is set to this value. However, it goes without saying that if a silver-based powder having a tapped density exceeding 6 g/cm$^3$ is available, such a silver-based powder is very suitably used.

Further, the silver-based powder preferably has an ignition loss in the range of 0.05 to 1.0%. The ignition loss is called "Ig loss" by those skilled in the art. The Ig loss is a value determined from the weight change before and after heat treatment by preliminarily heat-treating the silver-based powder (e.g., at 100° C. for 2 hours) to previously remove moisture and then further heat-treating it at high temperature (e.g., 1000° C.). That is, the Ig loss can be considered as the amount of an organic or volatile component present in the silver-based powder. For example, when the weight of the silver-based powder whose moisture has been removed is defined as W0 and the weight of the silver-based powder after heating to a high temperature is defined as W1, the Ig loss can be determined as [(W0−W1)/W0]×100%.

The organic or volatile component present in the silver-based powder inhibits sintering of the silver-based powder upon firing of the conductive paste and therefore increases electrical resistance. Therefore, the Ig loss is preferably as low as possible in order to appropriately reduce the electrical resistance of a resulting conductive film. When the silver-based powder is used for forming a conductive film of a semiconductor device, the Ig loss shall be 1.0% or less, preferably 0.30% or less, more preferably 0.25% or less, even more preferably 0.20% or less.

It is to be noted that it is generally difficult to obtain a commercially-available silver-based powder satisfying the above-described powder characteristics (average particle size, specific surface area, tapped density) and having an Ig loss of less than 0.05%, and therefore in this embodiment, the lower limit of the Ig loss is set to 0.05%. For this reason, the preferred range of the Ig loss is 0.05 to 1.0%. However, it goes without saying that if a silver-based powder having an Ig loss of less than 0.05% is available, such a silver-based powder is very suitably used.

When the conductive powder (A) is a silver-based powder satisfying the above-described characteristics, satisfactory sintering more easily proceeds upon firing of the conductive paste, and as will be described later, better synergy between the first additive (B) and the second additive (C) can be obtained. Particularly, the use of a silver-based powder satisfying the above-described characteristics as the conductive powder (A) makes it possible to form many closed cells, which will be described later, in a conductive film obtained by firing. This makes it possible to obtain good contact resistance and to improve the connection strength of a solder tab line.

The conductive powder (A) content of the conductive paste is not particularly limited, but is preferably in the range of 60 to 95 wt % with respect to the total weight of the conductive paste. If the conductive powder (A) content (contained amount, content rate) is less than 60 wt %, there is a case where, depending on the composition of the conductive paste, the specific resistance of a resulting conductive film increases due to too low a conductive powder (A) content. On the other hand, if the conductive powder (A) content exceeds 95 wt %, there is a case where the printability of the conductive paste is deteriorated so that a resulting conductive film is poor in physical adhesive strength.

(B) First Additive

The first additive (B) used in the present invention shall be selenium (Se) and/or tellurium (Te) or a compound thereof. Specifically, as described above, at least one substance selected from a first group consisting of Se, Te, a compound containing Se, and a compound containing Te can be used as the first additive (B).

This first additive (B) interacts with components such as the conductive powder (A), the second additive (C), and the glass frit (D), which allows fire-through to appropriately proceed upon firing.

The specific structure of selenium and tellurium is not particularly limited as long as selenium and tellurium are each a simple substance, and selenium and tellurium may each be a mixture of two or more allotropes.

Specific examples of the compound containing selenium include, but are not limited to, ferroselenium, alloy selenide, selenium dioxide, selenite, selenate, selenium disulfide, and selenium organometallic compounds. In this embodiment, among them, selenium dioxide (SeO$_2$) is particularly preferably used.

Specific examples of the compound containing tellurium include, but are not limited to, inorganic compounds of tellurium such as tellurium chloride, tellurium dioxide, tellurous acid compounds, zinc telluride, tellurium tetrabromide, aluminum telluride, cadmium telluride, hydrogen telluride, potassium telluride, sodium telluride, gallium telluride, silver telluride, chromium telluride, germanium telluride, cobalt telluride, mercury telluride, tin telluride, tungsten telluride, titanium telluride, copper telluride, lead telluride, bismuth telluride, arsenic telluride, manganese telluride, molybdenum telluride, telluric acid, ammonium metatellurate, potassium metatellurate, rubidium metatellurate, sodium metatellurate, lead metatellurate, tellurium iodide, tellurium sulfide, diphenyl ditelluride, and tellurium octylate; and organometal compounds of tellurium. In this embodiment, among them, tellurium dioxide ($TeO_2$) is particularly preferably used.

The first additives (B) mentioned above may be used singly or in appropriate combination of two or more of them. When the first additive (B) is a compound containing Se or Te, as described above, an oxide of Se or Te is preferably used.

The first additive (B) content (contained amount, content rate) of the conductive paste is not particularly limited, but when the first additive (B) is selenium and/or tellurium, the first additive (B) content is preferably in the range of 0.01 to 10 wt %, more preferably in the range of 0.1 to 5 wt % with respect to the total weight of the conductive paste. Further, when the first additive (B) is a compound containing selenium and/or a compound containing tellurium, the first additive (B) content is preferably in the range of 0.01 to 10 wt %, more preferably in the range of 0.1 to 8 wt %, even more preferably in the range of 0.1 to 4 wt % with respect to the total weight of the conductive paste.

When the first additive (B) content is within the above range, the first additive (B) can appropriately exert its effect on suppressing sintering of the conductive powder (A), and in addition, good fire-through can be achieved by combined use with the second additive (C) that will be described later. On the other hand, if the first additive (B) content is less than 0.01 wt %, there is a case where, depending on the composition of the conductive paste, the effect of suppressing sintering of the conductive powder (A) cannot be sufficiently obtained or good synergy cannot be obtained even by combined use with the second additive (C). If the first additive (B) content exceeds 10 wt %, there is a case where the resistance of a resulting conductive film increases so that the value of FF reduces.

(C) Second Additive

The second additive (C) used in the present invention is used in combination with the first additive (B), and is a compound of an element belonging to Group 5, 6, 7, 14, or 15 in the periodic table. More specifically, the second additive (C) shall be a compound containing at least one element selected from a second group consisting of vanadium (V, Group 5), niobium (Nb, Group 5), tantalum (Ta, Group 5), antimony (Sb, Group 15), bismuth (Bi, Group 15), manganese (Mn, Group 7), germanium (Ge, Group 14), silicon (Si, Group 14), and tungsten (W, Group 6).

It is to be noted that among the elements of the second group, Sb, Ge, and Si are generally classified as semimetals, but the other elements of the second group are all metals. Therefore, in this embodiment, the element of the second group is sometimes referred to as "metal or the like" for the sake of convenience, which means that the elements of the second group include not only metals but also semimetals.

The compound of the metal or the like of the second group is not particularly limited, but a typical example thereof is at least one of an oxide, a chloride, a fluoride, a hydroxide, a nitrate, a carbonate, and an organic complex.

More specifically, examples of the oxide include vanadium(II) oxide (VO), vanadium(III) oxide ($V_2O_3$), vanadium(V) oxide ($V_2O_5$), niobium(IV) oxide ($NbO_2$), niobium(V) oxide ($Nb_2O_5$), tantalum(V) oxide ($Ta_2O_5$), antimony(III) oxide ($Sb_2O_3$), antimony(V) oxide ($Sb_2O_5$), bismuth(III) oxide ($Bi_2O_3$), manganese(II) oxide (MnO), manganese(III) oxide ($Mn_2O_3$), manganese(IV) oxide ($MnO_2$), germanium(IV) oxide ($GeO_2$), silicon dioxide (silica, $SiO_2$), tungsten(IV) oxide ($WO_2$), tungsten(VI) oxide ($WO_3$), and the like. Examples of the chloride include vanadium(II) chloride ($VCl_2$), vanadium(III) chloride ($VCl_3$), vanadium(IV) chloride ($VCl_4$), niobium(V) chloride ($NbCl_5$), tantalum(V) chloride ($TaCl_5$), antimony(III) chloride ($SbCl_3$), antimony(V) chloride ($SbCl_5$), bismuth(III) chloride ($BiCl_3$), manganese(II) chloride ($MnCl_2$, $MnCl_2 \cdot 4H_2O$), germanium(IV) chloride ($GeCl_4$), silicon(IV) chloride ($SiCl_4$), tungsten(IV) chloride ($WCl_4$), tungsten(VI) chloride ($WCl_6$), and the like. Examples of the fluoride include vanadium(III) fluoride ($VF_3$), antimony(III) fluoride ($SbF_3$), antimony(V) fluoride ($SbF_5$), bismuth(III) fluoride ($BiF_3$), manganese(II) fluoride ($MnF_2$), manganese(III) fluoride ($MnF_3$), and the like. Examples of the hydroxide include bismuth(III) hydroxide ($Bi(OH)_3$), manganese(II) hydroxide ($Mn(OH)_2$), and the like. Examples of the nitrate include bismuth(III) nitrate ($Bi(NO_3)_3 \cdot 5H_2O$), manganese(II) nitrate ($Mn(NO_3)_2 \cdot 6H_2O$, $Mn(NO_3)_2 \cdot 4H_2O$), and the like. Examples of the carbonate include manganese(II) carbonate ($MnCO_3$) and the like. Examples of the organic complex include publicly known organic vanadium complexes, organic niobium complexes, organic tantalum complexes, organic bismuth complexes, organic manganese complexes, organic germanium complexes, organic tungsten complexes, and the like.

These compounds may be either anhydrides or hydrates. The second additive (C) to be used shall be at least one of these compounds, and these compounds may be used in appropriate combination of two or more of them. When two or more of these compounds are used as the second additive (C), compounds of different metals or the like may be used in combination (e.g., a combination of vanadium oxide and niobium oxide), different compounds of the same metal or the like may be used in combination (e.g., a combination of vanadium oxide and vanadium chloride), or compounds of the same species different in valence may be used in combination (e.g., a combination of vanadium(II) oxide and vanadium(III) oxide).

The second additive (C) content (contained amount, content rate) of the conductive paste is not particularly limited, but is preferably in the range of 0.01 to 5 wt %, more preferably in the range of 0.1 to 5 wt % with respect to the total weight of the conductive paste. If the second additive (C) content is less than 0.01 wt %, there is a case where, depending on the composition of the conductive paste, synergy between the first additive (B) and the second additive (C) cannot be sufficiently obtained due to too low a second additive (C) content. On the other hand, if the second additive (C) content exceeds 5 wt %, there is a case where synergy between the first additive (B) and the second additive (C) cannot be obtained in proportion to the amount of the second additive (C) added.

(D) Glass Frit

In the present invention, glass frit publicly known in the field of conductive pastes for forming a conductive film can be suitably used as the glass frit (D). Particularly, glass frit having a softening point of 300 to 700° C. is preferably used. The reason for this is that when the conductive paste is fired at 750 to 950° C., good fire-through can be achieved (the antireflective layer can be eroded) so that a resulting conductive film can be properly adhered to a semiconductor substrate.

If the softening point of the glass frit (D) is lower than 300° C., there is a case where good fire-through cannot be achieved even when firing proceeds. On the other hand, if the softening point is higher than 700° C., there is a case where a resulting conductive film cannot exhibit good adhesive strength because of the fear that sufficient melt flow does not occur upon firing.

The characteristics of the glass frit (D) other than the melting point are not particularly limited. For example, the shape of powder of the glass frit (D) is not particularly limited, and the glass frit (D) may be a spherical powder or an indefinite-shaped powder having irregular-shaped particles. Further, the average particle size of the glass frit (D) is not particularly limited, either as long as it is within a range publicly known in the field of solar cell electrodes.

The specific type of the glass frit (D) is not particularly limited, but preferred examples of the glass frit (D) to be used include Bi-based glass, $Bi_2O_3$—$B_2O_3$—ZnO-based glass (bismuth-boron-zinc-based glass), $Bi_2O_3$—$B_2O_3$-based glass (bismuth-boron-based glass), $Bi_2O_3$—$B_2O_3$—$SiO_2$-based glass (bismuth-borosilicate-based glass), Ba-based glass, BaO—$B_2O_3$—ZnO-based glass (barium-boron-zinc-based glass), Te—Ba-based glass, $B_2O_3$—$SiO_2$-based glass (borosilicate glass), and $B_2O_3$—$SiO_2$—ZnO-based glass (borosilicate-zinc-based glass). These glass frits (D) may be used singly or in appropriate combination of two or more of them. Among them, BaO—$B_2O_3$-based glass, BaO—$B_2O_3$—ZnO-based glass, $B_2O_3$—$SiO_2$-based glass, and $B_2O_3$—$SiO_2$—ZnO-based glass are particularly preferably used.

The glass frit (D) content (contained amount, content rate) is not particularly limited, but is usually preferably in the range of 0.05 to 10 wt % with respect to the total weight of the conductive paste. When the glass frit (D) content of the conductive paste is within the above range, a resulting conductive film can have good adhesive strength to a substrate, and good fire-through can be achieved due to synergy between the first additive (B) and the second additive (C). On the other hand, if the glass frit (D) content is less than 0.05 wt %, there is a fear that a conductive film after firing cannot exhibit sufficient adhesive strength to a substrate. If the glass frit (D) content exceeds 10 wt %, there is a fear that flotation of glass occurs on a conductive film after firing or poor soldering occurs on a conductive film.

(E) Organic Binder

In the present invention, a resin publicly known in the field of conductive pastes for forming a conductive film can be suitably used as the organic binder (E). Specific examples of the organic binder (E) include, but are not limited to, cellulose derivatives such as methyl cellulose and ethyl cellulose, acrylic resins, alkyd resins, polypropylene-based resins, polyvinyl chloride-based resins, polyurethane-based resins, rosin-based resins, terpene-based resins, phenol-based resins, aliphatic petroleum resins, acrylic ester-based resins, xylene-based resins, coumarone-indene-based resins, styrene-based resins, dicyclopentadiene-based resins, polybutene-based resins, polyether-based resins, urea-based resins, melamine-based resins, vinyl acetate-based resins, and polyisobutyl-based resins.

The organic binder (E) content (contained amount, content rate) of the conductive paste is not particularly limited, but is preferably in the range of 0.05 to 30 wt % with respect to the total weight of the conductive paste. If the organic binder (E) content is less than 0.05 wt %, there is a fear that when the conductive paste is printed on a semiconductor substrate, sufficient adhesive strength to the semiconductor substrate cannot be ensured. On the other hand, if the organic binder (E) content exceeds 30 wt %, there is a fear that the printability of the conductive paste is deteriorated because the viscosity of the conductive paste tends to significantly increase. Further, if the organic binder (E) content exceeds 30 wt %, poor sintering is likely to occur due to inadequate debinding upon sintering.

(F) Solvent

In the present invention, a solvent publicly known in the field of conductive pastes for forming a conductive film can be suitably used as the solvent (F). Specific examples of the solvent (F) include, but are not limited to, hexane, toluene, ethyl cellosolve, cyclohexanone, butyl cellosolve, butyl cellosolve acetate, butyl carbitol, butyl carbitol acetate, diethylene glycol diethyl ether, diacetone alcohol, terpineol, methyl ethyl ketone, benzyl alcohol, 2,2,4-trimethyl-1,3-pentanediol monoisobutyrate, and the like.

The solvent (F) content (contained amount, content rate) of the conductive paste is not particularly limited as long as it is adequate to achieve good printability. For example, the solvent (F) content is preferably in the range of 1 to 40 wt % with respect to the total weight of the conductive paste. When the solvent (F) content is within the above range, a resulting conductive paste can usually have good printability. On the other hand, if the solvent (F) content is outside the above range, there is a case where, depending on the composition of the conductive paste, the printability of the conductive paste is deteriorated due to too small or too large a solvent (F) content.

Conductive Paste for Forming Conductive Film

A method for producing the conductive paste for forming a conductive film according to the present invention is not particularly limited, and a method publicly known in the field of conductive pastes can be suitably used. A typical example of such a method is one in which the above-described components are blended in predetermined proportions and made into a paste with the use of a publicly known kneader. An example of the kneader is a triple roll mill.

The conductive paste for forming a conductive film according to the present invention shall contain the components (A) to (F) described above, but may further contain a different component (G) publicly known in the field of conductive pastes for forming a conductive film. Specific examples of the different component (G) include a dispersant, a stabilizer, an antioxidant, an ultraviolet absorber, a silane coupling agent, a defoamer, a viscosity adjuster, and the like. The amount of the different component (G) contained in the conductive paste is not particularly limited as long as the physical properties and functions of the conductive paste and a resulting conductive film and the functions and effects of the components (A) to (F) are not affected.

Among those blended as the different component (G), a dispersant is preferably blended depending on the composition of the conductive paste. In the present invention, the first additive (B) and the glass frit (D) are used as components that contribute to fire-through, and in addition, the second additive (C) is also used in combination with them. Therefore, particularly, when these additives are dispersed well in the conductive paste, better fire-through can be achieved due to synergy among these additives. Further, when the conductive powder (A) is dispersed well in the conductive paste, deterioration in printability can be avoided and a resulting conductive film can have a lower electrical resistance. For this reason, if necessary, a dispersant may be added to the conductive paste.

Specific examples of the dispersant include, but are not limited to, organic acids such as stearic acid, palmitic acid, myristic acid, oleic acid, and lauric acid. The dispersant is not limited to these organic acids, and a publicly known common dispersant can also be suitably used.

When the dispersant is blended, the dispersant content (contained amount, content rate) of the conductive paste is not particularly limited, but shall be in the range of 0.05 to 10 wt % with respect to the total weight of the conductive paste. If the dispersant content is less than 0.05 wt %, there is a fear that the dispersing effect of the dispersant cannot be sufficiently exhibited even when the dispersant is added. On the other hand, if the dispersant content exceeds 10 wt %, there is a case where the dispersing effect of the dispersant cannot be obtained in proportion to the amount of the dispersant added. Further, if the dispersant content is too large, there is also a fear that the specific resistance of a conductive film obtained by firing increases.

As the different component (G), a metal soap of an element of Group 2 in the periodic table may further be blended. By blending the metal soap, better fire-through can be achieved. Specific examples of the metal soap include, but are not limited to, those mentioned in Patent Document 3 such as calcium stearate, magnesium stearate, strontium stearate, and magnesium gluconate. The metal soap content (contained amount, content rate) of the conductive paste is not particularly limited, either as long as it is in the range of 0.1 to 5 wt % with respect to the total weight of the conductive paste.

Semiconductor Device and Method for Producing the Same

Hereinbelow, a semiconductor device including the conductive paste for forming a conductive film according to the present invention and a method for producing the same will be specifically described with reference to FIGS. 1 and 2. It is to be noted that the same or similar components are given the same reference signs in all the drawings, and the description thereof will not be repeated below.

The above-described conductive paste for forming a conductive film according to the present invention is printed in a predetermined pattern on a semiconductor substrate and then fired, which makes it possible to form a conductive film having the predetermined pattern on the semiconductor substrate. Firing causes debinding of the organic binder (E) and sintering of the conductive powder (A) so that a conductive film is formed. At this time, fire-through occurs due to the glass frit (D), which is well promoted by synergy between the first additive (B) and the second additive (C).

A method for printing the conductive paste according to the present invention is not particularly limited, but screen printing can be generally used. Alternatively, a publicly known printing method other than screen printing, such as ink-jet printing, gravure printing, or transfer printing, may be employed. A firing method is not particularly limited, either, and various publicly known firing methods may be employed as long as the conductive paste according to the present invention can be sintered and fire-through can be achieved.

For example, when a conductive film is formed as an electrode of a solar cell element, a publicly known fast firing furnace having two or more heating zones may be used. The firing temperature is not particularly limited, either as long as the peak temperature of firing is in the range of 700 to 950° C. Particularly, in the case of the conductive paste according to the present invention, fire-through as good as or better than that achieved at a firing temperature of 800 to 850° C. can be achieved even at a firing temperature of about 750° C.

A semiconductor device according to the present invention is not particularly limited as long as it is produced using the conductive paste according to the present invention and has a conductive film formed by printing and firing the conductive paste. Specific examples of the semiconductor device include those having a film-like electrode or wiring, such as solar cell elements, thin-film transistors, and light-emitting diodes. Here, as will be described later, the conductive film obtained by using the conductive paste according to the present invention has closed cells in at least either its surface or inside.

A method for producing a semiconductor device according to the preset invention shall include the step of printing and firing the conductive paste according to the present invention to form a conductive film, and specific production processes or production conditions may be appropriately selected according to the type of the semiconductor device to be produced.

Figure 2:
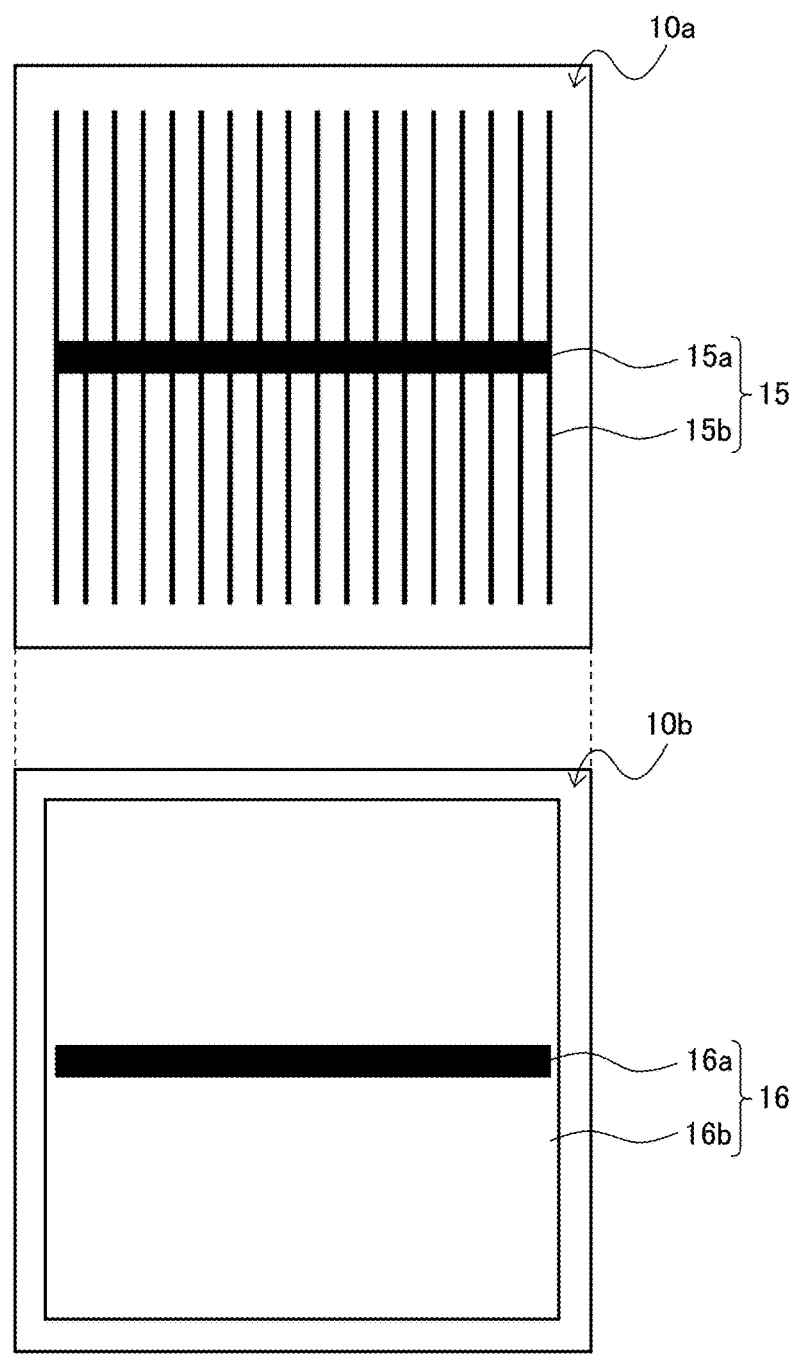
FIG. 2 is a schematic plan view showing the contrast between front electrode and back electrodes of the solar cell element shown in FIG. 1.

With reference to FIGS. 1 and 2, a solar cell element and a method for producing the same will be specifically described as an example of the semiconductor device according to the present invention and the method for producing the same.

As shown in a schematic sectional view in FIG. 1, a solar cell element 10 exemplified in this embodiment includes a semiconductor substrate 11, a diffusion layer 12, an antireflective layer 13, a BSF (Back Surface Field) layer 14, a front electrode 15, and a back electrode 16.

In this embodiment, the semiconductor substrate 11 is a silicon substrate made of, for example, monocrystalline or polycrystalline silicon. In this embodiment, this semiconductor substrate 11 is doped with a trivalent element, such as boron, as a semiconductor impurity, and has a specific resistance of, for example, about 1.0 to 2.0 Ωcm. When the semiconductor substrate 11 is a monocrystalline silicon substrate, a silicon ingot is produced by, for example, a pulling up method, and when the semiconductor substrate 11 is a polycrystalline silicon substrate, a silicon ingot is produced by, for example, a casting method. The silicon ingot formed by a pulling up method or a casting method is sliced to obtain a silicon substrate having a thickness of 200 μm or less, preferably 150 μm or less. It is to be noted that the following description will be made with reference to a case where the semiconductor substrate 11 is a p-type silicon substrate, but of course, the semiconductor substrate 11 may be an n-type silicon substrate.

In order to clean the slice surface of the semiconductor substrate 11, a front surface 10a is subjected to slight etching with an alkali solution such as NaOH or KOH or an acid solution such as hydrofluoric acid or fluonitric acid. Then, the front surface 10a is preferably subjected to dry etching, wet etching, or the like to form surface irregularities (rough surface). The surface irregularities formed on the front surface 10a can give the front surface 10a the function of reducing the reflectivity of light so that the front surface 10a can act as a light entrance surface (light-receiving surface) of the solar cell element 10.

The diffusion layer 12 is formed in the front surface 10a that is a light-receiving surface of the semiconductor substrate 11, and its conductivity type is opposite to that of the semiconductor substrate 11. In this embodiment, the diffusion layer 12 is formed by doping with a pentavalent element, such as phosphorus, as a semiconductor impurity. In this embodiment, the diffusion layer 12 is an n+ type layer having a sheet resistance of about 40 to 100Ω/□. Therefore, a pn junction is formed between the semiconductor substrate 11 that is a p-type silicon substrate and the diffusion layer 12.

A method for forming the diffusion layer 12 is not particularly limited, but the diffusion layer 12 is formed by, for example, a coating thermal diffusion method in which diphosphorus pentaoxide ($P_2O_5$) in the form of paste is applied and thermally diffused, a vapor-phase thermal diffusion method using gaseous phosphorus oxychloride ($POCl_3$) as a diffusion source, or an ion implantation method in which a $P^+$ ion is directly diffused. The depth of the diffusion layer 12 from the front surface 10a of the semiconductor substrate 11 shall be about 0.3 to 0.5 μm. The method for forming the diffusion layer 12 is not limited to the above methods. For example, a hydrogenated amorphous silicon film or a crystalline silicon film including a microcrystalline silicon film may be formed using a thin-film technique. Further, an i-type silicon region (not shown) may be formed between the semiconductor substrate 11 and the diffusion layer 12.

It is to be noted that if a diffusion region is formed also in an unnecessary area, the diffusion region shall be removed later by etching. As will be described later, when a BSF region of a back surface 10b that is an anti-light-receiving surface is formed with an aluminum paste, aluminum as a p-type dopant can be diffused to an adequate depth at an adequate concentration. Therefore, the influence of a shallow n-type diffusion layer is negligible. For this reason, even when an n-type diffusion layer is formed in the back surface 10b, it is not particularly necessary to remove the n-type diffusion layer.

The antireflective layer 13 is formed on the front surface 10a (light-receiving surface) side so as to be stacked on the diffusion layer 12 to prevent the refection of incident light and protect the front surface 10a of the solar cell element 10. Examples of a material that can be used for forming the antireflective layer 13 include an $SiN_x$ film (the composition of x varies around $Si_3N_4$), a $TiO_2$ film, an $SiO_2$ film, an MgO film, an ITO film, an $SnO_2$ film, a ZnO film, and the like.

The thickness of the antireflective layer 13 can be appropriately selected according to the type of the semiconductor material so that conditions can be reproduced under which appropriate incident light does not reflect. For example, when the semiconductor substrate 11 is a silicon substrate, the antireflective layer 13 shall have a reflectivity of about 1.8 to 2.3 and a thickness of about 500 to 1000 Å. A method for forming the antireflective layer 13 is not particularly limited, and may be, for example, CVD, vapor deposition, or sputtering.

The BSF layer 14 is formed in the back surface 10b that is an anti-light-receiving surface of the semiconductor substrate 11. The BSF layer 14 is a region in the back surface 10b of the semiconductor substrate 11 where a trivalent element that is the same as the dopant of the semiconductor substrate 11 is diffused at a high concentration. The BSF layer 14 is not an essential component for the solar cell element 10, but the presence of the BSF layer 14 makes it possible to effectively suppress a reduction in conversion efficiency caused by carrier recombination. Examples of a semiconductor impurity used for the BSF layer 14 include boron and aluminum. The BSF layer 14 is a p+ type layer having such a semiconductor impurity at a high concentration, and therefore can form an ohmic contact with the back electrode 16.

A method for forming the BSF layer 14 is not particularly limited. For example, the BSF layer 14 can be formed at about 800 to 1000° C. by a thermal diffusion method using boron tribromide ($BBr_3$) as a diffusion source. When such a thermal diffusion method is employed, a diffusion barrier such as an oxide film is preferably formed in advance on the diffusion layer 12 that has already been formed. Alternatively, another method using aluminum may be employed in which an aluminum paste containing an aluminum powder and an organic vehicle is applied and then fired at about 600 to 850° C. to diffuse aluminum toward the semiconductor substrate 11. This method has the advantages that a desired diffusion region can be formed in a surface onto which the aluminum paste is applied and it is not necessary to remove an unnecessary diffusion layer in the back surface 10b. Further, fired aluminum can be directly used also as a collector electrode 16b of the back electrode 16.

The front electrode 15 is formed on the light-receiving surface (front surface 10a) of the semiconductor substrate 11, and the back electrode 16 is formed on the anti-light-receiving surface (back surface 10b) of the semiconductor substrate 11. Specifically, as shown in FIG. 2 in addition to FIG. 1, the front electrode 15 includes a bus bar electrode 15a and finger electrodes 15b, and the back electrode 16 includes a bus bar electrode 16a and a collector electrode 16b.

The finger electrodes 15b constituting the front electrode 15 are a plurality of narrow electrodes arranged in parallel on the light-receiving surface to collect photocurrent generated from the semiconductor substrate 11. The bus bar electrode 15a is a strip-shaped electrode arranged so as to intersect the finger electrodes 15b to further collect photocurrent collected by the individual finger electrodes 15b and output it to the outside. The front electrode 15 is formed by applying the conductive paste for forming a conductive film according to the present invention onto the antireflective layer 13 in a comb-like pattern by the above-described publicly known printing method to form the bus bar electrode 15a and the finger electrodes 15b and then firing the conductive paste at a peak temperature of about 750 to 950° C. for several tens of seconds to several tens of minutes.

The collector electrode 16b and the bus bar electrode 16a constituting the back electrode 16 are provided so as to be opposed to the front electrode 15. In this embodiment, as shown in the lower diagram in FIG. 2, the collector electrode 16b and the bus bar electrode 16a are formed so as to overlap each other. In this embodiment, the bus bar electrode 16a of the back electrode 16 is formed using, for example, a silver-aluminum paste containing a silver powder, an aluminum powder, an organic binder, a solvent, and glass frit. The collector electrode 16b is formed by, for example, applying an aluminum paste containing an aluminum powder, an organic binder, a solvent, and glass frit onto the entire back surface 10b of the semiconductor substrate 11 and firing the aluminum paste.

It is to be noted that when the front electrode 15 and the back electrode 16 are formed, the conductive paste for forming the front electrode 15 and the conductive paste for forming the back electrode 16 are preferably fired at the same time after applied onto the front surface 10a and the back surface 10b of the semiconductor substrate 11, respectively, and dried. In this case, the step of forming the front electrode 15 and the step of forming the back electrode 16 can be performed in substantially one step, which makes it possible to reduce the number of production steps. It is to be noted that the order in which the conductive paste for forming the front electrode 15 and the conductive paste for forming the back electrode 16 are applied is not particularly limited.

A solar cell module can be produced by connecting such solar cell elements 10 by wiring. Specifically, for example, the front electrode 15 of one of the adjacent solar cell elements 10 and the back electrode 16 of the other solar cell element 10 are connected by a publicly known wire (e.g., a solder tab line). It is to be noted that the wire usually connects the bus bar electrode 15a of the front electrode 15 and the bus bar electrode 16a of the back electrode 16 to each other. Then, the solar cell elements 10 are sandwiched between a front filling material and a back filling material (both of which are made of a transparent thermoplastic resin or the like).

Then, a transparent member made of glass is provided on the upper surface of the front filing material, and a back protective material is provided on the lower surface of the back filling material so that a layered structure is formed. The back protective material is formed by, for example, coating a resin sheet (made of, for example, polyethylene terephthalate) having excellent mechanical characteristics with a polyvinyl fluoride film having excellent weather resistance. In this embodiment, the layered structure is subjected to deaeration in an appropriate vacuum furnace, and is then heated and pressed to integrate its layers together. In this way, a solar cell module is produced.

It is to be noted that when the solar cell elements 10 are connected in series in the solar cell module, one end of the electrode of the first solar cell element 10 and one end of the electrode of the last solar cell element 10 shall be connected to a terminal box as an output extraction unit by output extracting wiring. The solar cell module is usually placed in the open air for a long period of time, and therefore its periphery may be protected with a frame made of aluminum or the like.

Closed Cells of Conductive Film

As described above, the front electrode 15 formed using the conductive paste for forming a conductive film according to the present invention has closed cells. Such closed cells will be specifically described with reference to FIGS. 3 and 4.

Figure 3:
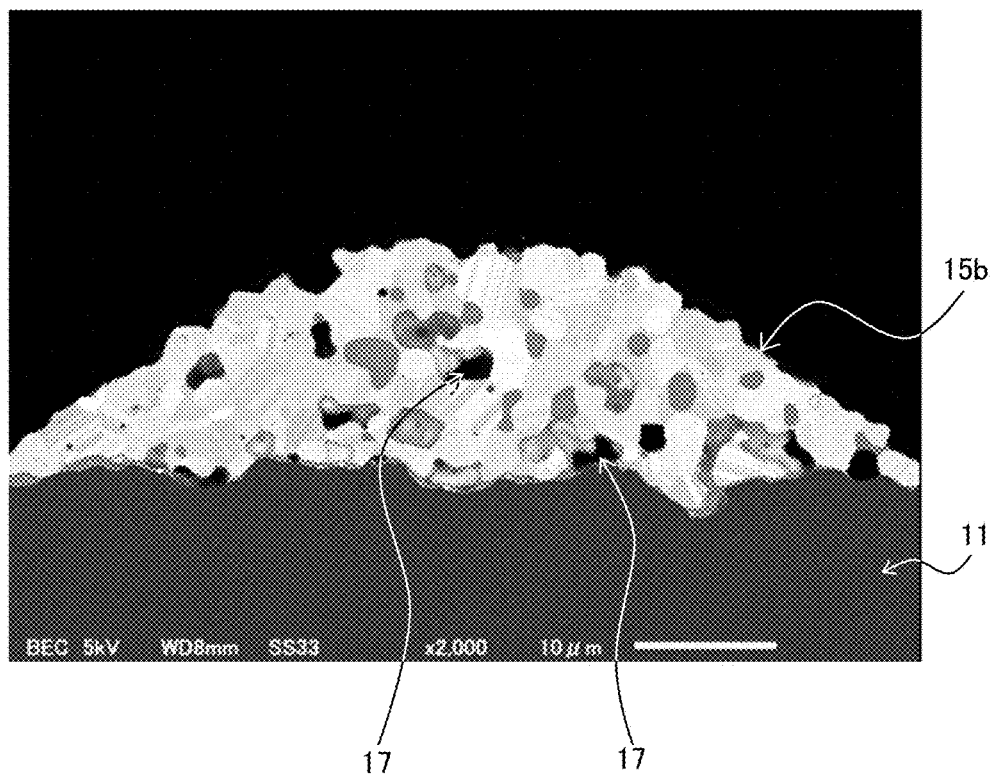
FIG. 3 shows one example of the result of electron microscope observation of a section of a finger electrode as the front electrode of the solar cell element shown in FIG. 2.
Figure 4:
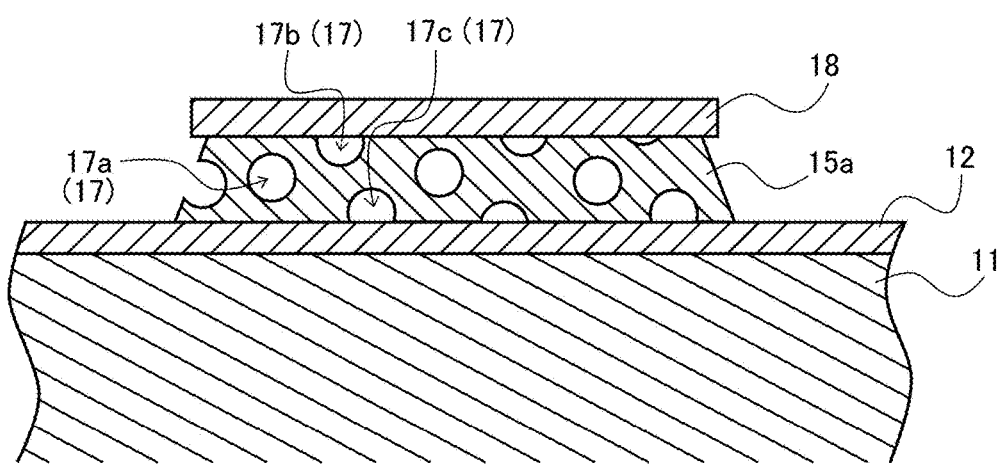
FIG. 4 is a schematic sectional view of the solar cell element shown in FIGS. 1 and 2, in which a solder tab line is connected to a bus bar electrode as the front electrode.

The bus bar electrode 15a and the finger electrodes 15b of the front electrode 15 are formed using the conductive paste according to the present invention. As shown in FIGS. 3 and 4, a plurality of closed cells 17 are formed in at least one of the surface and the inside of the front electrode 15 due to synergy among the first additive (B), the second additive (C), and the glass frit (D) upon sintering.

FIG. 3 is a sectional view of the finger electrode 15b shown in the upper diagram in FIG. 2, which was observed with an electron microscope. In FIG. 3, the lower portion shows the semiconductor substrate 11 and the central portion having a curved surface shows the finger electrode 15b. The finger electrode 15b has the closed cells 17 formed therein. FIG. 4 is a schematic sectional view of the bus bar electrode 15a, shown in FIG. 1 and the upper diagram in FIG. 2, and its vicinity. As shown in FIG. 4, the bus bar electrode 15a has the closed cells 17 formed therein. It is to be noted that in FIG. 4, the bus bar electrode 15a is connected with a solder tab line 18. For the sake of convenience, in FIG. 4, the semiconductor substrate 11 and the diffusion layer 12 are shown but the antireflective layer 13 is not shown.

The function of such closed cells 17 will be specifically described with reference to FIG. 4. The closed cells 17 shown in FIG. 4 are conveniently classified into a closed cell 17a present inside the bus bar electrode 15a (front electrode 15, conductive film), a closed cell 17b located at the boundary with the solder tab line 18, and a closed cell 17c located at the boundary with the semiconductor substrate 11 (surface 10a, diffusion layer 12).

Among these closed cells 17, the presence of at least the closed cells 17c located at the boundary with the semiconductor substrate 11 makes it possible to relax stress at the boundary between the surface electrode 15 and the semiconductor substrate 11. Such stress relaxation function effectively suppresses the occurrence of microcracks in the front electrode 15 even upon sintering. Further, the suppression of the occurrence of microcracks makes it possible to effectively suppress also an increase in the contact resistance of the front electrode 15.

Further, the presence of the closed cells 17a inside the bus bar electrode 15a particularly makes it possible to relax also stress generated when the solder tab line 18 is connected to the bus bar electrode 15a. Specifically, when the solder tab line 18 is connected to the bus bar electrode 15a, the volume expansion of the bus bar electrode 15a is likely to occur due to heat generated by solder connection, but the closed cells 17a effectively reduce such volume expansion. Therefore, stress generated by volume expansion is also relaxed, which makes it possible to effectively suppress the occurrence of microcracks in the bus bar electrode 15a. The other closed cells 17b and 17c as well as the closed cells 17a contribute to such relaxation of stress generated by heat.

Further, the closed cells 17a to 17c can further improve the connection strength between the bus bar electrode 15a and the solder tab line 18. In general, the strength of tab connection changes depending on the thickness of the bus bar electrode 15a. When the electrode has a larger thickness, the strength of tab connection is usually higher. The presence of the closed cells 17a to 17c increases the volume itself of the bus bar electrode 15a. Therefore, according to the present invention, it is possible to improve the connection strength between the bus bar electrode 15a and the solder tab line 18.

That is, the fact that the volume of the bus bar electrode 15a is increased by the closed cells 17a to 17c means that the thickness of the bus bar electrode 15a can be made larger than that proportionate to the amount of the conductive powder (A) actually contained in the conductive paste. Therefore, formation of the closed cells 17a to 17c makes it possible to ensure adequate connection strength between the bus bar electrode 15a and the solder tab line 18 even when the amount of the conductive powder (A) used is reduced.

Further, the presence of the closed cells 17b facing the solder tab line 18, that is, the closed cells 17b formed in the surface of the bus bar electrode 15a after sintering makes it possible to further improve the connection strength between the bus bar electrode 15a and the solder tab line 18, because the area of contact between the bus bar electrode 15a and solder increases and part of the molten solder is expected to enter the closed cells 17b. A larger area of contact between solder and an object to be connected makes connection strength higher. The presence of the closed cells 17b increases the area of contact between the surface of the bus bar electrode 15a and solder. In addition, when part of the solder enters the closed cells 17b, the solder after solidification can function as an anchor in the closed cells 17b. This makes it possible to further improve the strength of tab connection.

The size of the closed cells 17 is not particularly limited, but when the conductive paste according to the present invention is fired, the closed cells 17 having a size of 1 µm or more are usually formed. Therefore, the preferred lower limit of the size of the closed cells 17 shall be 1 µm. The upper limit of the size of the closed cells 17 is not particularly limited, either, but the closed cells 17 usually have a size of 10 µm or less. Therefore, the preferred size range of the closed cells 17 shall be 1 µm or more but 10 µm or less (1 to 10 µm). When the closed cells 17 have a size within the above range, the above-described stress relaxation function and tab connection strength-improving function can be appropriately achieved. It is to be noted that the size of the closed cells can be measured by observing a section of a formed conductive film (e.g., a front electrode or a bus bar electrode) polished by a polisher with the use of a scanning electron microscope (SEM) or the like.

As described above, the conductive paste for forming a conductive film according to the present invention is used for forming a conductive film of a semiconductor device and includes: (A) a conductive powder; (B) a first additive; (C) a second additive; (D) glass frit; (E) an organic binder; and (F) a solvent, wherein the first additive (B) is at least one selected from a first group consisting of an Se element, a Te element, a compound containing Se, and a compound containing Te, and the second additive (C) is a compound of at least one metal selected from a second group consisting of V, Nb, Ta, Sb, Bi, Mn, Ge, Si, and W.

When the conductive paste contains Se, Te, or a compound thereof as the first additive (B), a compound of at least one selected from the second group is used as the second additive (C) in combination with the first additive (B). The first additive (B) allows the conductive paste to achieve good fire-through particularly at a firing temperature of about 800 to 850° C., but the combined use of the first additive (B) and the second additive (C) allows the conductive paste to achieve fire-through as good as or better than that achieved by firing at about 800 to 850° C. even when the firing temperature is reduced to, for example, about 750° C.

Further, the combined use of the first additive (B) and the second additive (C) makes it possible to form a plurality of closed cells in a resulting conductive film. The presence of such closed cells makes it possible to relax stress on the conductive film to suppress the occurrence of microcracks and also makes it possible to improve the connection strength between the conductive film and wiring. The suppression of the occurrence of microcracks and the improvement in connection strength can greatly contribute to a reduction in the contact resistance of the conductive film. Therefore, when the semiconductor device is, for example, a solar cell element, a reduction in FF can be effectively suppressed, and the conversion efficiency of the solar cell element can also be improved.

It is to be noted that Patent Document 1 discloses a conductive paste containing a substance that changes to gas at a temperature in the range of 150 to 800° C. and a metal oxide in combination. However, this document mainly describes only the function of the substance that changes to gas at a temperature in the range of 150 to 800° C., and unlike the present invention, does not at all disclose the synergy of combined use of the first additive (B) and the second additive (C) (contribution to solution in solid state and reaction of the conductive powder (A), the first additive (B), and the glass frit (D) upon firing).

Further, Patent Document 2 discloses combined use of a bismuth- or phosphorus-based additive and a metal oxide. However, this document does not disclose an additive corresponding to the first additive (B) used in the present invention, and therefore does not disclose the synergy of combined use of the first additive (B) and the second additive (C), either. Further, Patent Document 3 discloses a technique fundamental to the present invention, and therefore does not disclose combined use of the first additive (B) and the second additive (C). Therefore, it is clear that the present invention is superior in functions and effects to the inventions disclosed in Patent Documents 1 to 3.

EXAMPLES

The present invention will be more specifically described based on the following examples, comparative examples, and reference examples, but is not limited thereto. Various changes, alterations, and modifications may be made thereto by those skilled in the art without departing from the scope of the present invention. It is to be noted that in the following examples, comparative examples, and reference examples, preparation of measuring samples and measurement and evaluation of contact resistance and FF were performed in the following manner.

Measuring Samples

In examples, comparative examples, and reference examples, solar cell elements as semiconductor devices were used as samples for measuring contact resistance and FF. The measuring samples had a p-type 6-inch crystalline silicon wafer as a semiconductor substrate, an n-type diffusion layer with a sheet resistance of 80Ω/□, and an $SiN_x$ layer as an antireflective layer. The measuring samples also had a BSF layer formed using the following conductive paste for forming a back electrode.

Conductive Paste for Back Electrode

A conductive paste for forming a BSF layer and a collector electrode (referred to as a first conductive paste for back electrode) was prepared by blending 70 parts by weight of an aluminum powder having an average particle size of about 3 μm, 1 part by weight of ethyl cellulose (organic binder), 28 parts by weight of 2,2,4-trimethyl-1,3-pentanediol monoisobutyrate (solvent), and 1 part by weight of $Bi_2O_3$—$B_2O_3$—ZnO-based glass frit (softening point: about 405° C.) and mixing them with a triple roll mill.

A conductive paste for forming a back bus bar electrode (referred to as a second conductive paste for back electrode) was prepared by blending 80 parts by weight of a silver powder having an average particle size of about 1 μm, 2.4 parts by weight of an aluminum powder having an average particle size of about 3 μm, 1 part by weight of ethyl cellulose (organic binder), 15 parts by weight of 2,2,4-trimethyl-1,3-pentanediol monoisobutyrate (solvent), 1.5 parts by weight of $Bi_2O_3$—$B_2O_3$—ZnO-based glass frit (softening point: about 405° C.), and 0.1 part by weight of stearic acid (dispersant) and mixing them with a triple roll mill.

Measurement and Evaluation of Contact Resistance

Figure 5:
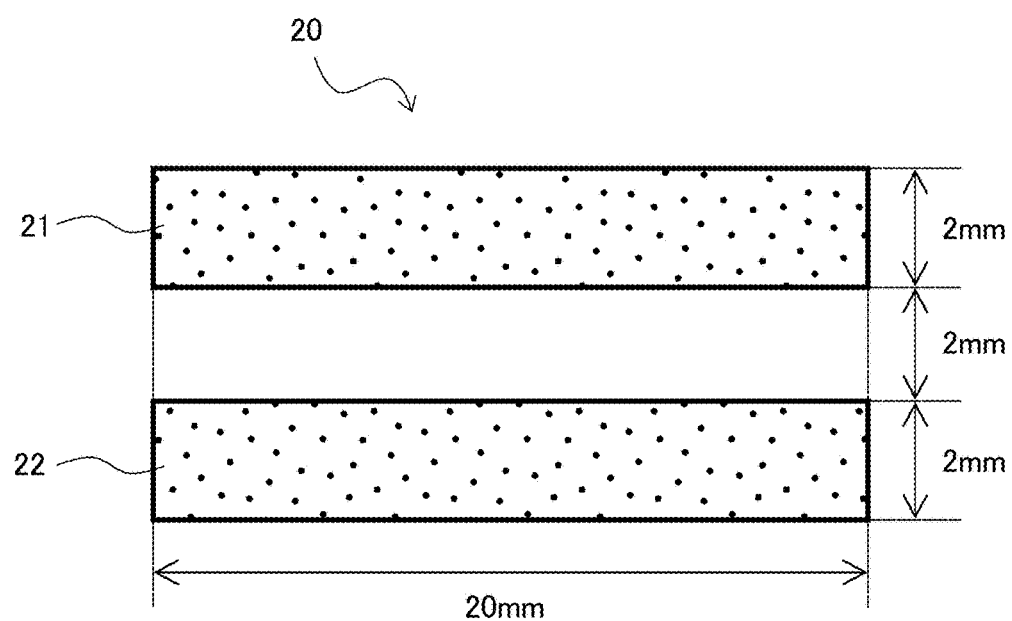
FIG. 5 is a plan view of a specific test pattern for measuring the contact resistance of a conductive film in Examples of the present invention.

A conductive paste prepared in an example, a comparative example, or a reference example was printed by screen printing on the surface of the measuring sample and dried at 150° C. for 5 minutes, and was then naturally cooled to room temperature. Then, the conductive paste was fired at a peak temperature of 750° C. in a fast firing furnace to form a test pattern 20 shown in FIG. 5. It is to be noted that only in Example 2, in addition to the test pattern 20 formed by firing at a peak temperature of 750° C., a test pattern 20 formed by firing at a peak temperature of 800° C. was also prepared. This test pattern 20 has a structure in which strip-shaped electrodes 21 and 22 having a size of 2 mm×20 mm are arranged in parallel with a gap of 2 mm.

The resistance between the strip-shaped electrodes 21 and 22 was measured by a 4-terminal probe with the use of a multimeter manufactured by ADC CORPORATION (trade name: ADCMT 7541A) to obtain a contact resistance reading. The obtained reading was evaluated relative to Comparative Example.

Measurement and Evaluation of FF

A BSF layer and a collector electrode were printed on the back surface of the sample using the first conductive paste for back electrode, and then a bus bar electrode was printed using the second conductive paste for back electrode. Then, a front electrode was further printed on the front surface of the sample using a conductive paste prepared in an example, a comparative example, or a reference example. The front electrode had a comb-shaped pattern formed by 80 finger electrodes having a width of 60 μm and 3 bus bar electrodes having a width of 1.5 mm. Then, drying treatment, cooling treatment, and firing treatment were performed in the same manner as in the measurement of contact resistance to obtain a sample for measuring FF. However, in Comparative Example 1 and Examples 1 to 7, two samples were obtained by performing firing treatment at peak temperatures of 750° C. and 800° C., respectively.

The FF of the sample for measuring FF was measured using a tester manufactured by KYOSHIN ELECTRIC CO., LTD. (trade name: KST-15Ce-1s) and a solar simulator manufactured by WACOM ELECTRIC CO., LTD. (trade name: WXS-156S-10, AM1.5G). As in the case of the evaluation of contact resistance, the obtained FF reading was evaluated relative to Comparative Example.

Comparative Example 1

A paste was prepared by blending 86 parts by weight of a silver powder having an average particle size of 1.0 μm, a specific surface area of 0.4 m$^2$/g, a tapped density of 4.5 g/cm$^3$, and an Ig loss of 0.8% as the conductive powder (A), 3 parts by weight of TeO$_2$ as the first additive (B), 2 parts by weight of BaO—B$_2$O$_3$—ZnO-based glass frit I (softening point: about 630° C.) as the glass frit (D), 1 part by weight of ethyl cellulose as the organic binder (E), 11 parts by weight of 2,2,4-trimethyl-1,3-pentanediol monoisobutyrate as the solvent (F), and 0.5 part by weight of stearic acid (dispersant) and 0.5 part by weight of magnesium stearate (metal soap) as the different component (G) and mixing them by a triple roll mill. A small amount of the solvent (F) was further added to the paste to adjust its viscosity for screen printing to about 300 Pa·s. In this manner, a conductive paste of Comparative Example 1 was obtained.

As described above, the conductive paste of Comparative Example 1 was used to measure contact resistance and FF. As shown in Table 1, the results of Comparative Example 1 were used as reference values of contact resistance and FF.

Reference Example 1

A conductive paste of Reference Example 1 was obtained in the same manner as in Comparative Example 1 except that TeO$_2$ as the first additive (B) was not blended.

As described above, the conductive paste of Reference Example 1 was used to measure contact resistance and FF, and the contact resistance and FF were evaluated relative to the results of Comparative Example 1. The results of Reference Example 1 are shown in Table 1.

Examples 1 to 7

As shown in Table 1, conductive pastes of Examples 1 to 7 were obtained in the same manner as in Comparative Example 1 except that vanadium(V) oxide (Example 1), bismuth(III) oxide (Example 2), antimony(III) oxide (Example 3), silicon dioxide (Example 4), manganese(IV) oxide (Example 5), germanium(IV) oxide (Example 6), or tungsten(VI) oxide (Example 7) was blended as the second additive (C) in an amount of 0.1 part by weight, respectively.

As described above, each of the conductive pastes of Examples 1 to 7 was used to measure contact resistance and FF, and the contact resistance and FF were evaluated relative to the results of Comparative Example 1. The results of Examples 1 to 7 are shown in Table 1. It is to be noted that as described above, only in Example 2, both the test pattern 20 obtained by firing at a peak temperature of 750° C. and the test pattern 20 obtained by firing at a peak temperature of 800° C. were subjected to measurement of contact resistance. Therefore, the result at 750° C. and the result at 800° C. are both shown in Table 1 as the results of contact resistant of Example 2.

TABLE 1

| | First additive | Second additive | | Contact resistance (750° C.) | FF | |
|---|---|---|---|---|---|---|
| | | Type | Content | | 750° C. | 800° C. |
| Comparative Example 1 | TeO$_2$ | None | 0 | 1 | 1 | 1.01 |
| Reference Example 1 | None | None | 0 | 10 | 0.4 | 0.42 |
| Example 1 | TeO$_2$ | V$_2$O$_5$ | 0.1 | 0.916 | 1.040 | 1.040 |
| Example 2 | TeO$_2$ | Bi$_2$O$_3$ | 0.1 | 0.890 0.895 (800° C.) | 1.060 | 1.060 |
| Example 3 | TeO$_2$ | Sb$_2$O$_3$ | 0.1 | 0.840 | 1.030 | 1.020 |
| Example 4 | TeO$_2$ | SiO$_2$ | 0.1 | 0.988 | 1.010 | 1.010 |
| Example 5 | TeO$_2$ | MnO$_2$ | 0.1 | 0.970 | 1.010 | 1.010 |
| Example 6 | TeO$_2$ | GeO$_2$ | 0.1 | 0.950 | 1.010 | 1.010 |
| Example 7 | TeO$_2$ | WO$_3$ | 0.1 | 0.920 | 1.020 | 1.020 |

* The first additive content was always 3 parts by weight.

Examples 8 to 16

Conductive pastes of Examples 8 to 16 were obtained in the same manner as in Comparative Example 1 except that bismuth(III) oxide (Examples 8 to 11) or antimony(III) oxide (Examples 12 to 16) was blended as the second additive (C) in an amount shown in Table 2, respectively.

As described above, each of the conductive pastes of Examples 8 to 16 was used to measure contact resistance, and the contact resistance was evaluated relative to the result of Comparative Example 1. The results of Examples 8 to 16 are shown in Table 2.

TABLE 2

| | Second additive | | Contact resistance |
|---|---|---|---|
| | Type | Content | (750° C.) |
| Example 8 | Bi$_2$O$_3$ | 0.2 | 0.685 |
| Example 9 | Bi$_2$O$_3$ | 0.3 | 0.739 |
| Example 10 | Bi$_2$O$_3$ | 0.5 | 0.810 |
| Example 11 | Bi$_2$O$_3$ | 1 | 0.980 |
| Example 12 | Sb$_2$O$_3$ | 0.1 | 0.950 |
| Example 13 | Sb$_2$O$_3$ | 0.2 | 0.900 |
| Example 14 | Sb$_2$O$_3$ | 0.3 | 0.890 |
| Example 15 | Sb$_2$O$_3$ | 0.5 | 0.820 |
| Example 16 | Sb$_2$O$_3$ | 1 | 1.000 |

* TeO$_2$ was blended as the first additive in an amount of 3 parts by weight (not shown in the table).

Example 17

A conductive paste of Example 17 was obtained in the same manner as in Example 8 (Comparative Example 1) except that magnesium stearate (metal soap of an element of Group 2 in the periodic table) as the different component (G) was not blended.

As described above, the conductive paste of Example 17 was used to measure contact resistance, and the contact resistance was evaluated relative to the result of Comparative Example 1. The result of Example 17 is shown in Table 3 together with the result of Example 8 (see Table 2).

TABLE 3

|  | Second additive | | Different | Contact resistance |
|---|---|---|---|---|
|  | Type | Content | component | (750° C.) |
| Example 17 | $Bi_2O_3$ | 0.2 | None | 0.690 |
| Example 8 | $Bi_2O_3$ | 0.2 | Magnesium stearate | 0.685 |

* $TeO_2$ was blended as the first additive in an amount of 3 parts by weight (not shown in the table).

Examples 18 to 26

Conductive pastes of Examples 18 to 26 were obtained in the same manner as in Comparative Example 1 except that bismuth(III) nitrate (pentahydrate, Examples 18 to 22), bismuth(III) chloride (Example 23), bismuth(III) fluoride (Example 24), antimony(III) chloride (Example 25), or antimony(V) fluoride (Example 26) was blended as the second additive (C) in an amount shown in Table 4, respectively.

As described above, each of the conductive pastes of Examples 18 to 26 was used to measure contact resistance, and the contact resistance was evaluated relative to the result of Comparative Example 1. The results of Examples 18 to 26 are shown in Table 4.

TABLE 4

|  | Second additive | | Contact resistance |
|---|---|---|---|
|  | Type | Content | (750° C.) |
| Example 18 | $Bi(NO_3)_3 \cdot 5H_2O$ | 0.1 | 1.000 |
| Example 19 | $Bi(NO_3)_3 \cdot 5H_2O$ | 0.2 | 0.990 |
| Example 20 | $Bi(NO_3)_3 \cdot 5H_2O$ | 0.3 | 0.990 |
| Example 21 | $Bi(NO_3)_3 \cdot 5H_2O$ | 0.5 | 0.980 |
| Example 22 | $Bi(NO_3)_3 \cdot 5H_2O$ | 0.8 | 0.970 |
| Example 23 | $BiCl_3$ | 0.1 | 0.950 |
| Example 24 | $BiF_3$ | 0.1 | 0.890 |
| Example 25 | $SbCl_3$ | 0.1 | 0.920 |
| Example 26 | $SbF_5$ | 0.1 | 0.870 |

* $TeO_2$ was blended as the first additive in an amount of 3 parts by weight (not shown in the table).

Comparative Example 2

A conductive paste of Comparative Example 2 was obtained in the same manner as in Comparative Example 1 except that $B_2O_3$—$SiO_2$-based glass frit II (softening point: about 650° C.) was used as the glass frit (D).

As described above, this conductive paste of Comparative Example 2 was used to measure contact resistance. As shown in Table 5, the result of Comparative Example 2 was used as a reference value of contact resistance.

Reference Example 2

A conductive paste of Reference Example 2 was obtained in the same manner as in Comparative Example 2 except that $TeO_2$ as the first additive (B) was not blended.

As described above, the conductive paste of Reference Example 2 was used to measure contact resistance, and the contact resistance was evaluated relative to the result of Comparative Example 2. The result of Reference Example 2 is shown in Table 5.

Examples 27 to 32

As shown in Table 5, conductive pastes of Examples 27 to 32 were obtained in the same manner as in Comparative Example 2 except that vanadium(III) oxide (Example 27), bismuth(III) oxide (Example 28), antimony(III) oxide (Example 29), silicon dioxide (Example 30), manganese(IV) oxide (Example 31), or germanium(IV) oxide (Example 32) were blended as the second additive (C) in an amount of 0.1 part by weight, respectively.

As described above, each of the conductive pastes of Examples 27 to 32 was used to measure contact resistance, and the contact resistance was evaluated relative to the result of Comparative Example 2. The results of Examples 27 to 32 are shown in Table 5.

TABLE 5

|  | First additive | Second additive | | Contact resistance |
|---|---|---|---|---|
|  |  | Type | Content | (750° C.) |
| Comparative Example 2 | $TeO_2$ | None | 0 | 1 |
| Reference Example 2 | None | None | 0 | 12 |
| Example 27 | $TeO_2$ | $V_2O_3$ | 0.1 | 0.890 |
| Example 28 | $TeO_2$ | $Bi_2O_3$ | 0.1 | 0.900 |
| Example 29 | $TeO_2$ | $Sb_2O_3$ | 0.1 | 0.880 |
| Example 30 | $TeO_2$ | $SiO_2$ | 0.1 | 0.920 |
| Example 31 | $TeO_2$ | $MnO_2$ | 0.1 | 0.960 |
| Example 32 | $TeO_2$ | $GeO_2$ | 0.1 | 0.920 |

* The first additive content was always 3 parts by weight.

Comparison of Results of Examples, Comparative Examples, and Reference Examples

As is clear from the comparison of results between Comparative Example 1 and Examples of 1 to 26 and the comparison of results between Comparative Example 2 and Examples 27 to 32, the present invention can achieve contact resistance and FF as good as or better than those of Comparative Example 1 (i.e., the invention disclosed in Patent Document 3) due to the combined use of the first additive (B) and the second additive (C). Further, as can be seen from the comparison between the results of Examples 1 to 26 (and Comparative Example 1) and the results of Examples 27 to 32 (and Comparative Example 2), the combined use of the first additive (B) and the second additive (C) makes it possible to achieve good contact resistance and FF even when the type of the glass frit (D) is changed.

Particularly, when comparisons are made between the results at 750° C. and the results at 800° C. of FF of Examples 1 to 7, in the cases of Examples 1, 2, and 4 to 7, the results at 750° C. and the results at 800° C. are the same, and in the case of Example 3, the result at 750° C. is higher than the result at 800° C., whereas the result of FF of Comparative Example 1 containing no second additive (C) is lower at 750° C. than at 800° C. It can be seen from the results that the combined use of the first additive (B) and the second additive (C) makes it possible to achieve good fire-through regardless of the firing temperature.

Further, when a comparison is made between the result at 750° C. and the result at 800° C. of contact resistance of Example 2, the obtained values are almost the same (as described above, there is no difference also between the result at 750° C. and the result at 800° C. of FF). It can be seen from the results of Example 2 that the combined use of the first additive (B) and the second additive (C) makes it possible to obtain a good conductive film regardless of the firing temperature. It is to be noted that as for contact resistance, only the results at 750° C. are shown and the results at 800° C. are not shown in the other examples. However, according to the present invention, it is possible to form a good conductive film in both cases where the peak temperature is 750° C. and where the peak temperature is 800° C.

It is clear from the results of Examples 1 to 32 that good contact resistance and FF can be achieved by using an oxide, a chloride, a fluoride, or a nitrate of V, Sb, Bi, Mn, Ge, Si, or W. However, although experimental results are not shown, the use of a compound of Nb or Ta also makes it possible to achieve good contact resistance and FF. Further, the use of a hydroxide, a carbonate, or an organic complex of V, Nb, Ta, Sb, Bi, Mn, Ge, Si, or W also makes it possible to achieve good contact resistance and FF.

Further, as can be seen from the comparison between the result of Example 17 and the result of Example 8, according to the present invention, good contact resistance can be achieved by combined use of at least the first additive (B) and the second additive (C) even when a metal soap of an element of Group 2 in the periodic table is not contained, and depending on conditions, contact resistance (or FF) can be improved by using, in combination with them, a metal soap of an element of Group 2 in the periodic table as the different component (G).

Further, as can be clearly seen from the results of Examples 8 to 22, good contact resistance and FF can be achieved when the second additive (C) content is 0.1 to 1 wt %. However, even when the second additive (C) content is 0.01 to 10 wt %, good contact resistance and FF can be achieved. Here, for the purpose of comparison of the second additive (C), only the examples where $TeO_2$ was blended in an amount of 3 parts by weight as the first additive (B) are shown as Examples 1 to 32. However, as is clear from the disclosure of Patent Document 3 that is a background technique of the present invention, good contact resistance and FF can be achieved by blending Se, Te, a compound containing Se, or a compound containing Te in an amount of 0.01 to 10 wt %.

Further, when a section of the finger electrode of the sample for measuring FF obtained in Example 1 was observed with an electron microscope, as shown in FIG. 3, formation of closed cells was detected. It can be seen from this that the presence of closed cells also contributes to good contact resistance and FF. As for the formation of closed cells, similar results were obtained also in the other examples. Also as for tab connection strength between a bus bar electrode and a solder tab line, good results were obtained.

Further, as is clear from the comparison among the results of Reference Examples 1 and 2, the results of Comparative Examples 1 and 2, and the results of Examples 1 to 32, much better contact resistance and FF can be achieved when the conductive paste contains at least the first additive (B) as an additive than when the conductive paste contains no additive. It can be seen from this that according to the present invention, good results can be obtained due to the synergy of combined use of the first additive (B) and the second additive (C).

It is to be noted that the present invention is not limited to the above-described embodiments, and various changes may be made within the scope of the appended claims, and other embodiments and embodiments obtained by appropriately combining technical means disclosed in two or more modified examples are also included in the technical scope of the present invention.

INDUSTRIAL APPLICABILITY

The present invention is widely and suitably applicable to the field of forming a conductive film, such as an electrode or wiring, of a semiconductor device such as a solar cell element.

DESCRIPTION OF REFERENCE SIGNS

10 Solar cell element
10*a* Front surface of solar cell element
10*b* Back surface of solar cell element
11 Semiconductor substrate
12 Diffusion layer
13 Antireflective layer
14 BSF layer
15 Front electrode
15*a* Bus bar electrode
15*b* Finger electrode
16 Back electrode
16*a* Bus bar electrode
16*b* Collector electrode
17 Closed cell
17*a* to 17*c* Closed cell
18 Solder tab line
20 Test pattern
21 Strip-shaped electrode
22 Strip-shaped electrode

What is claimed is:

1. A conductive paste for forming a conductive film of a semiconductor device, comprising:
    (A) a conductive powder comprising a silver-based powder having a specific surface area of 0.2 to 3.0 $m^2/g$, a tapped density of 2 to 6 $g/cm^3$, an average particle size of 0.1 to 5.0 μm, and an ignition loss after removing moisture by heat treatment of 0.05 to 1.0%;
    (B) as a first additive, at least one selected from a first group consisting of Se, Te, and a compound containing Te, wherein the amount of the first additive (B) contained in the conductive paste for forming a conductive film is 0.01 to 10 wt % with respect to the total weight of the conductive paste for forming a conductive film;
    (C) as a second additive used in combination with the first additive, a compound containing at least one element selected from a second group consisting of V, Nb, Ta, Sb, Bi, Mn, Ge, Si, and W, wherein the amount of the second additive (C) contained in the conductive paste for forming a conductive film is 0.01 to 5 wt % with respect to the total weight of the conductive paste for forming a conductive film;
    (D) glass frit;
    (E) an organic binder; and
    (F) a solvent.

2. The conductive paste for forming a conductive film according to claim 1, wherein the conductive powder (A) further contains at least one metal selected from a third group consisting of Cu, Ni, Al and Pd.

3. The conductive paste for forming a conductive film according to claim 2, wherein the conductive powder (A) is at least one of
    (A-1) a metal powder made of at least one metal selected from the third group, (A-2) an alloy powder containing at least one metal selected from the third group, (A-3) a coated powder whose surface is coated with at least one metal selected from the third group, and (A-4) a metal compound powder made of a compound of at least one metal selected from the third group to develop conductivity after heat treatment.

4. The conductive paste for forming a conductive film according to claim 1, wherein the second additive (C) is at least one of an oxide, a chloride, a fluoride, a hydroxide, a nitrate, a carbonate, and an organic complex of at least one element selected from the second group.

5. The conductive paste for forming a conductive film according to claim 1, wherein the glass frit (D) is at least one selected from the group consisting of $BaO$—$B_2O_3$-based glass, $BaO$—$B_2O_3$—$ZnO$-based glass, $B_2O_3$—$SiO_2$-based glass, and $B_2O_3$—$SiO_2$—$ZnO$-based glass.

6. A semiconductor device comprising a conductive film formed by printing and firing the conductive paste for forming a conductive film according to claim 1, wherein
the conductive film has closed cells in at least one of its surface and inside.

7. A method for producing a semiconductor device, comprising the step of printing and firing the conductive paste for forming a conductive film according to claim 1.

* * * * *